United States Patent [19]
Ohtsuki et al.

[11] Patent Number: 6,077,879
[45] Date of Patent: Jun. 20, 2000

[54] CURABLE RESIN AND RESIN COMPOSITION

[75] Inventors: Nobuaki Ohtsuki, Suita; Toshio Awaji, Kawanishi, both of Japan

[73] Assignee: Nippon Shokubai Co., Ltd., Osaka, Japan

[21] Appl. No.: 09/189,407

[22] Filed: Nov. 10, 1998

[30] Foreign Application Priority Data

Nov. 11, 1997 [JP] Japan .................................. 9-308229

[51] Int. Cl.⁷ .................................. C08G 2/46; C08J 3/28
[52] U.S. Cl. ........................ 522/101; 525/531; 525/533; 528/112; 528/113; 528/405; 528/421
[58] Field of Search ............................ 522/101; 528/112, 528/113, 405, 421; 525/531, 533

[56] References Cited

U.S. PATENT DOCUMENTS 4,614,775  9/1986  Bekooij et al. ........................ 525/533
5,009,982  4/1991  Kamayachi et al. .

FOREIGN PATENT DOCUMENTS 0 273 729   7/1988  European Pat. Off. .
61-243869  10/1986  Japan .
63-258975  10/1988  Japan .
7-242716    9/1995  Japan .

*Primary Examiner*—Robert Dawson
*Assistant Examiner*—D. Aylward
*Attorney, Agent, or Firm*—Oblon, Spivak, McClelland, Maier & Neustadt, P.C.

[57] ABSTRACT

The present invention provides a radically polymerizable curable resin obtained by modifying an epoxy resin by reacting a phenol compound having an alcoholic hydroxyl group; and an unsaturated monobasic acid, to the epoxy resin having two or more epoxy groups in a molecule. The epoxy resin is reacted with the phenol compound and the unsaturated monobasic acid. The curable resin is subjected to polymerization curing with heat or light to form a cured product having excellent heat resistance, moisture resistance, and adhesion to substrates. The present invention also provides a curable resin composition containing the curable resin, as well as an alkaline-developable curable resin capable of forming a coating layer having excellent tack-free property, quick developability and excellent properties of cured layer.

9 Claims, No Drawings

CURABLE RESIN AND RESIN COMPOSITION

BACKGROUND OF THE INVENTION

The present invention relates to a curable resin capable of providing a cured product having excellent heat resistance, moisture resistance, and flexibility, and a curable resin composition containing the curable resin.

Epoxy acrylate (i.e., a vinyl ester resin), which is produced by modifying an epoxy resin with an unsaturated monobasic acid, can be cured with heat or light, and its chemical resistance is excellent. Due to such advantages, epoxy acrylate is used as a curable resin in applications such as various molding materials and coating materials.

However, in these applications, there is a problem that the epoxy acrylate causes the decrease in the free volume of the molding material and the coating material in the curing process. The decrease in the free volume generates the accumulation of internal stress. As a consequence, the molding materials form molded products which has cracks and warping, and is poor in properties such as heat resistance and moisture resistance. In addition, the coating materials form coating layers having poor adhesion to substrates to be coated.

In addition to the above applications, the epoxy acrylate is widely used as a photo-curable resin for image formation and minute work utilized for patterning a printed circuit board. In this industrial field, there is a demand for a resin to which a principle of photo-imaging can be applied as the minuteness of the printed circuit board proceeds, and also which can be developed in a diluted weak alkaline aqueous solution for environmental protection. From these points of view, at the present, epoxy acrylate containing carboxyl groups has been used as a photo-curable resin for image formation. The carboxyl group-containing epoxy acrylate is obtained by reacting epoxy acrylate with polybasic anhydride to introduce carboxyl groups (for example, Japanese Unexamined Patent Publications Nos. 61-243869 and 63-258975).

In the formation of patterns using the above-described liquid photo-curable resin composition containing the above-described photo-curable resin, the following process is employed. First, the curable resin composition is applied onto the surface of substrate, and then, is heated and dried to form a coating layer. Onto the coating layer, a patterning film is compressed, the resultant is exposed to light, then, is developed. In this process, if the coating layer is tacky after the heating and drying step, there arises a problem that, when the patterning film is peeled off, a part of resin composition adheres to the patterning film and patterns cannot be correctly reproduced, or the patterning film cannot be peeled off. Accordingly, the ability of forming the coating layer with tack-free property is an important requirement for the liquid photo-curable resin composition.

Furthermore, the developability after exposure to light is also an important requirement. That is, in order to form fine patterns with a high reliability at a good reproducibility, unexposed portions of the coating layer have to be removed rapidly in the developing step. However, the developability and the tack-free property are inconsistent characteristics with each other. The improvement of the developability tends to impair the tack-free property. There is a difficulty in attaining both good developability and good tack-free property.

Furthermore, the photo-curable resin has the same problem that the curable resin used in the molding material has. That is, the coating layer after pattern formation is subjected to high temperature or high moisture, it cracks or peels off from the substrate.

In the above mentioned problems, there has been proposed an idea to achieve the improvement of the developability, that the hydroxyl group is introduced to the resin with the reaction between epoxy- group and carboxyl group (Japanese Unexamined Patent Publication No. 7-242716). However the obtained cured resin was insufficient in resistance under the condition of high temperature and humidity. Under such circumstances, there is a demand for developing a photo-curable resin satisfying all the important characteristics including tack-free property, developability, adhesion to substrate, and the like.

SUMMARY OF THE INVENTION

It is an object of the present invention to provide a curable resin capable of forming a coating layer excellent in heat resistance, moisture resistance, and adhesion to substrate by polymerization curing with heat or light, and a resin composition produced using the same. It is other object of the present invention to provide a photo-curable resin satisfying tack-free property of the coating layer, developability, and the properties of cured layer.

According to an aspect of the present invention, a radically polymerizable curable resin obtained by modifying an epoxy resin by reacting a phenol compound having an alcoholic hydroxyl group and an unsaturated monobasic acid to epoxy resin having two or more epoxy groups in a molecule.

These and other objects, features and advantages of the invention will become more apparent upon reading the following detailed description.

DETAILED DESCRIPTION OF THE PREFERRED EMBODIMENT OF THE INVENTION

The curable resin of the present invention is a radically polymerizable curable resin obtained by modifying an epoxy resin. Specifically, the curable resin of the present invention is obtained by reacting an epoxy resin having two or more epoxy groups in a molecule with a phenol compound having an alcoholic hydroxyl group, and an unsaturated monobasic acid.

The reaction with the phenol compound having an alcoholic hydroxyl group results in introducing alcoholic hydroxyl groups into the curable resin via phenoxy groups. With the use of the phenol compound having an alcoholic hydroxyl group, the resultant curable resin is capable of forming a cured product having excellent and balanced heat resistance, moisture resistance, adhesion to substrate, and flexibility with good balance. The reaction with the unsaturated monobasic acid results in introducing radically polymerizable double bonds into the curable resin.

When a photo-curable resin composition for image formation is prepared using the curable resin of the present invention, the photo-curable resin composition is capable of forming a coating layer having good tack-free property and quick developability, and forming a cured layer having good properties.

As the epoxy resin used as a starting material of the curable resin of the present invention, any known epoxy resin can be used as far as it has two or more epoxy groups in a molecule. Examples thereof include: bisphenol epoxy resin; biphenyl epoxy resin; alicyclic epoxy resin; polyfunctional glycidyl amine resins such as tetraglycidyl aminodiphenyl methane; polyfunctional glycidyl ether resins such as tetraphenyl glycidylether ethane; phenol novolak epoxy resins and cresol novolak epoxy resins; a reaction product of epichlorohydrin with a polyphenol compound obtained by condensation reaction between the phenol compound such as phenol, o-cresol, m-cresol, and naphthol and aromatic aldehyde having phenolic hydroxyl groups; a reaction product of epichlorohydrin with a polyphenol compound obtained by additional reaction between the phenol compound and a diolefin compound such as divinylbenzene and dicyclopentadiene; ring-opened polymer of 4-vinylcyclohexene-1-oxide which is epoxidized with peroxy acid; epoxy resins having heterocyclic rings such as triglycidyl isocyanurate, and the like. In addition to the above, also usable as the epoxy resin is a compound obtained by coupling two or more molecules of the above-described epoxy resins with each other by chain-extension reaction using a chain-extension agent such as polybasic acids, polyphenol compounds, polyfunctional amino compounds, polythiols, and the like.

In order to introduce alcoholic hydroxyl groups into the curable resin via phenoxy groups, it is necessary to react the phenolic hydroxyl group of the phenol compound having an alcoholic hydroxyl group with epoxy groups of the epoxy resin. The phenolic hydroxyl group has different reactivity from that of the alcoholic hydroxyl group, and the epoxy group predominantly reacts with phenolic hydroxyl group.

The phenol compound having an alcoholic hydroxyl group has a structure in which an alcoholic hydroxyl group are indirectly coupled with a phenol compound. The phenol compound may have two or more alcoholic hydroxyl groups or phenolic hydroxyl groups, as well as other substituent groups except the alcoholic hydroxyl group and phenolic hydroxyl group. Naphthol having an alcoholic hydroxyl group may be used as the phenol compound.

Examples of the phenol compound include: hydroxyalkyl phenol or hydroxyalkyl cresol such as (bis)hydroxymethyl phenol, (bis)hydroxymethyl cresol, hydroxymethyl-di-t-butylphenol, p-hydroxyphenyl-2-ethanol, p-hydroxyphenyl-3-propanol, and p-hydroxyphenyl-4-butanol, hydroxyethyl cresol; an esterified product of carboxyl group-containing phenol compounds such as hydroxybenzoic acid, hydroxyphenylbenzoic acid, and hydroxyphenoxybenzoic acid with ethylene glycol, propylene glycol, glycerol, and the like; a monoethylene oxide addition product of bisphenol; a monopropylene oxide addition product of bisphenol, and the like. These may be used alone or as a mixture of two or more of them.

In order to introduce radically polymerizable unsaturated double bonds into the resin, it is necessary to react the epoxy groups of the epoxy resin with the unsaturated monobasic acid. The unsaturated monobasic acid is a monobasic acid having one carboxyl group and one or more radically polymerizable unsaturated bonds. Specific examples thereof include: acrylic acid, methacrylic acid, crotonic acid, cinnamic acid, β-acryloxypropionic acid, a reaction product of hydroxyalkyl (meth)acrylate having one hydroxyl group and one (meth)acryloyl group with dibasic anhydride, a reaction product of polyfunctional (meth)acrylate having one hydroxyl group and two or more (meth)acryloyl groups with dibasic anhydride, and the like. Among these, preferable is a compound having a (meth)acryloyl group such as acrylic acid, methacrylic acid. These may be used alone or as a mixture of two or more of them.

There are the following methods for reacting the epoxy resin with the phenol compound having an alcoholic hydroxyl group and the unsaturated monobasic acid: 1) the epoxy resin and the unsaturated monobasic acid are reacted with each other, and then, the resultant is reacted with the phenol compound having an alcoholic hydroxyl group; 2) the epoxy resin is reacted with the unsaturated monobasic acid and the phenol compound having an alcoholic hydroxyl group simultaneously; and 3) the epoxy resin and the phenol compound having an alcoholic hydroxyl group are reacted with each other, and then, the resultant is reacted with the unsaturated monobasic acid. Any of them may be employed.

It is preferable that 0.01 to 0.6 moles, and more preferably, 0.05 to 0.5 moles of the alcoholic hydroxyl group-containing phenol compound is reacted with respect to 1 chemical equivalent of the epoxy groups of the epoxy resin. If the amount of the phenol compound exceeds 0.6 moles, the curable resin has poor curability. If the amount thereof is smaller than 0.01 moles, the curable resin cannot form a cured product with good adhesion and flexibility. In addition, it is preferable that 0.4 to 0.99 moles, and more preferably, 0.5 to 0.95 moles of the unsaturated monobasic acid is reacted with respect to one chemical equivalent of the epoxy groups of the epoxy resin. If the amount of the unsaturated monobasic acid is smaller than 0.4 moles, the curable resin has poor curability.

It is preferable that the total amount of the phenol compound and the unsaturated monobasic acid is 0.8 to 1.1 moles with respect to 1 chemical equivalent of the epoxy groups of the epoxy resin. If the total amount is smaller than 0.8 moles, the introduced amount of the alcoholic hydroxyl groups and radically polymerized double bonds becomes too low. Thus-obtained curable resin forms a coating layer having poor adhesion to the substrate, and has poor radical polymerizability. On the other hand, if the total amount exceeds 1.1 moles, large amount of the phenol compound and the unsaturated monobasic acid remain unreacted. The large amount of the remaining low-molecular weight compounds impairs the characteristics of the resultant cured product.

As described above, the epoxy resin may be reacted with either one of the phenol compound or the unsaturated monobasic acid first, and then with the rest, or alternatively, may be reacted with the phenol compound and the unsaturated monobasic acid simultaneously. The reaction is conducted normally at 80 to 130° C. in the presence or absence of the diluent such as a radically polymerizable monomer or a solvent which will be described later in the coexistence with a polymerization inhibitor such as hydroquinone and oxygen, and a reaction catalyst including tertially amine such as triethylamine, quarternary ammonium salt such as triethylbenzylammonium chloride, imidazole compounds such as 2-ethyl-4-methyl imidazole, phosphorous compounds such as triphenylphosphine, metal salts of organic acid or inorganic acid, chelate compound, and the like. As a result of the reaction, the curable resin of the present invention is obtained.

In the reaction, the epoxy groups of the epoxy resin used as a starting material is ring-opened by the alcoholic hydroxyl group-containing phenol compound and the unsaturated monobasic acid. As a result of the ring-opening, alcoholic hydroxyl groups are generated in the curable resin. When the curable resin is mixed with a polybasic anhydride so that thus-generated alcoholic hydroxyl groups or the hydroxyl groups introduced by the alcoholic hydroxyl group-containing phenol compound are reacted with a polybasic anhydride, carboxyl groups are introduced into the curable resin. As a result, a curable resin having carboxyl groups is obtained. The carboxyl group-containing curable resin has an alkaline developability, and therefore, can be used as an alkaline developable curable resin for image-formation.

Examples of the polybasic anhydride includes: dibasic anhydrides such as phthalic anhydride, succinic anhydride, octenylsuccinic anhydride, pentadodecenylsuccinic anhydride, maleic anhydride, tetrahydrophthalic anhydride, hexahydrophthalic anhydride, methyltetrahydrophthalic anhydride, 3,6-endomethylenetetrahydrophthalic anhydride, methylendomethylenetetrahydrophthalic anhydride, tetrabromophthalic anhydride, and trimellitic anhydride; aliphatic or aromatic tetrabasic dianhydrides such as biphenyltetracarboxylic dianhydride, diphenyl ether tetracarboxylic dianhydride, butanetetracarboxylic dianhydride, cyclopentanetetracarboxylic dianhydride, pyromellitic dianhydride, and benzophenonetetracarboxylic dianhydride. These may be used alone or as a mixture of two or more of them.

In order to obtain the carboxyl group-containing curable resin, the polybasic anhydride is reacted with the curable resin in such a manner that the acid value of the finally-obtained carboxyl group-containing curable resin becomes 30 mgKOH or more per 1 g of the resin. In order to achieve this value, the polybasic anhydride is used in an amount of 0.1 to 1.1 moles with respect to 1 chemical equivalent of the hydroxyl groups of the curable resin.

The reaction between the curable resin and the polybasic anhydride is conducted normally at 50 to 130° C. in the presence or absence of the diluent such as a radically polymerizable monomer or a solvent which will be described later in the coexistence with a polymerization inhibitor such as hydroquinone, oxygen, and the like. If necessary, there may be further added a catalyst including tertially amines such as triethylamine, quarternary ammonium salts such as triethylbenzylammonium chloride, metal salts such as lithium chloride, and the like.

The curable resin and the carboxyl group-containing curable resin have hydroxyl groups and/or carboxyl groups. When these curable resins are respectively reacted with a chain-extension agent having two or more functional groups in a molecule reactable with the functional groups of these curable resins, two or more molecules in the respective curable resins are coupled with each other, thereby producing high molecular weight curable resins. As the chain-extension agent, a diisocyanate compound is used for the curable resin having hydroxyl groups, and a diepoxy compound or a dioxazoline compound is used for the curable resin having carboxyl groups.

The curable resin of the present invention has a structure in which aromatic rings are present between the alcoholic hydroxyl groups derived from the phenol compounds or the carboxyl groups introduced into the hydroxyl groups and the double bonds used as a bridge site in polymerization curing, and form a distance therebetween. That is, the distance between the functional groups and the main chain is longer than those of conventional radically polymerizable epoxy acrylate resins. With this structure, the functional groups effectively allow the curable resin to attain excellent adhesion to fillers and reinforcement materials when it is used as a matrix resin for composite materials, as well as excellent adhesion to substrates when it is used as a resin for adhesive agents, coating materials, and inks. In addition, since the carboxyl groups are present at a position distant from the main chain derived from the epoxy resin and double bonds which are highly hydrophobic, the alkaline developability is also improved.

The curable resin of the present invention is subjected to radical polymerization with heat or light. The radical polymerization is preferably started in the presence of a polymerization initiator. A curable resin composition including any one of the above-described curable resins and a polymerization initiator for starting heat- or photo-polymerization is also within the scope of the present invention.

As a heat-polymerization initiator, known compounds may be used. Examples thereof include: organic peroxides such as methyl ethyl ketone peroxide, benzoylperoxide, dicumylperoxide, t-butylhydroperoxide, cumenehydroperoxide, t-butylperoxyoctoate, t-butylperoxybenzoate, and lauroyl peroxide; and azo-compounds such as azobisisobutyronitrile. The heat-polymerization initiator may be added together with a curing accelerator into the resin composition. Typical examples of the curing accelerator include cobalt naphthenate, cobalt octoate and tertiary amine. The preferable amount of the heat-polymerization initiator is 0.05 to 5 parts by weight with respect to 100 parts by weight of the total amount of the curable resin and, if necessary, the radically polymerizable compound which will be described later.

As a photo-polymerization initiator, known compounds may be used. Examples thereof include: benzoins and their alkyl ethers such as benzoin, benzoin methyl ether, benzoin ethyl ether; acetophenones such as acetophenone, 2,2-dimethoxy-2-phenylacetophenone, 1,1-dichloroacetophenone, and 4-(1-t-butyldioxy-1-methylethyl) acetophenone; anthraquinones such as 2-methylanthraquinone, 2-amylanthraquinone, 2-t-buthylanthraquinone, and 1-chloroanthraquinone; thioxanthones such as 2,4-dimethylthioxanthone, 2,4-diisopropylthioxanthone, and 2-chlorothioxanthone; ketals such as acetophenonedimethyl ketal, and benzyldimethyl ketal; benzophenones such as benzophenone, 4-(1-t-butyldioxy-1-methylethyl) benzophenone, 3,3',4,4'-tetrakis (t-butyldioxycarbonyl) benzophenone; 2-methyl-1-[4-(methylthio) phenyl]-2-morpholino-propane-1-one and 2-benzyl-2-dimethylamino-1-(4-morpholinophenyl)-butanone-1; acylphosphine oxides and xanthones, and the like.

These compounds as the photo-polymerization initiator may be used alone or as a mixture of two or more of them. The use amount thereof is 0.5 to 30 parts by weight with respect to 100 parts by weight of the total amount of the curable resin and, if necessary, radically polymerizable compound which will be described later. If the amount of the photo-polymerization initiator is smaller than 0.5 parts by weight, long photo irradiation is required, or the photo-polymerization is hard to start even by irradiation with light. As a result, suitable surface hardness cannot be attained. On the other hand, there is no merit of using the photo-polymerization initiator in an amount exceeding 30 parts by weight.

The curable resin composition may further include a radically polymerizable compound, as described above. Examples of the radically polymerizable oligomer include unsaturated polyester, epoxy acrylate, urethane acrylate, and polyester acrylate. Examples of the radically polymerizable monomer include: aromatic vinyl monomers such as styrene, α-methylstyrene, α-chlorostyrene, vinyl toluene, divinylbenzene, diallylphthalate, and diallylbenzenephosphonate; vinyl ester monomers such as vinyl acetate, and vinyl adipate; (meth)acrylate monomers such as methyl (meth)acrylate, ethyl (meth)acrylate, butyl (meth)acrylate, β-hydroxyethyl (meth)acrylate, (2-oxo- 1,3-dioxolane-4- yl)-methyl (meth)acrylate, (di)ethyleneglycol di(meth) acrylate, propyleneglycol di(meth)acrylate, trimethylolpropane di(meth)acrylate, trimethylopropane tri(meth)acrylate, pentaerythritol tetra(meth)acrylate, dipentaerythritol hexa (meth)acrylate, and tris(hydroxyethyl) isocianurate tri(meth) acrylate; triallyl cyanurate, and the like. The radically polymerizable compound is selected from these compounds in accordance with the application and required characteristics of the curable resin. These compounds are used alone or may be used as a mixture of two or more of them.

In order to attain good workability in the process where the resin composition is applied onto the surface of substrate, a solvent may be added to the resin composition. Examples of the solvent include: hydrocarbons such as toluene and xylene; cellosolves such as butylcellosolve; carbitols such as carbitol and butylcarbitol; esters such as cellosolve acetate, carbitol acetate, and propyleneglycol monomethylether acetate; ketones such as methyl isobutyl ketone and methyl ethyl ketone; ethers such as diethylene glycol dimethyl ether, and the like. These may be used alone or as a mixture of two or more of them. The use amount of the solvent is adjusted so that the resin composition has the optimum viscosity when it is applied onto the substrate.

The resin composition may further include known additives in accordance with the necessity. Examples of such additives include: fillers such as talc, clay, and barium sulfate; color pigments; defoaming agents; coupling agents; leveling agents; sensitizers; mold release agents; lubricants, plasticizers; antioxidant; UV absorbers; flame retardants; polymerization inhibitors; thickners, and the like. The resin composition may also include epoxy resins such as novolak epoxy resin, bisphenol epoxy resin, alicyclic epoxy resin and triglycidyl isocyanurate, and epoxy curing agents such as dicyanodiamide and imidazole compound. When reinforcement fiber is added to the resin composition, fiber-reinforced composite material can be obtained.

When the curable resin into which no carboxyl groups are introduced is used as a photo-curable resin for image-formation, development is conducted using the solvent in the following manner. First, the curable resin is applied onto the substrate to form a coating layer, and then is exposed to light. The unexposed portions are developed with the above-described solvent or halogen solvent such as trichloroethylene.

When the curable resin into which carboxyl groups are introduced is used as a photo-curable resin, alkaline development can be conducted, because unexposed portions are dissolved in an alkaline aqueous solution. Examples of alkalines usable in the present invention include: alkaline metal compounds such as sodium carbonate, potassium carbonate, sodium hydroxide, and potassium hydroxide; alkaline earth metal compounds such as calcium hydroxide; ammonia; and water soluble organic amines such as monomethylamine, dimethylamine, trimethylamine, monoethylamine, diethylamine, triethylamine, monopropylamine, dimethylpropylamine, monoethanolamine, diethanolamine, triethanolamine, ethylenediamine, diethylenetriamine, dimethylaminoethylmethacrylate, polyethyleneimine, and the like. These may be used alone or as a mixture of two or more of them.

In the process of producing the curable resin of the present invention, an epoxy resin containing phenoxy groups having an alcoholic hydroxyl group can be obtained. The epoxy resin can be cured with known epoxy resin curing agents such as amines and anhydrides. The epoxy resin is mixed with various additives in accordance with the necessity, thereby producing an epoxy resin composition.

EXAMPLES

Hereinafter, the present invention will be further described in detail with reference to examples. However, it is to be noted that various changes and modifications will be apparent to those skilled in the art. Therefore, unless otherwise such change and modifications depart from the scope of the invention, they should be construed as being included therein. In the Examples, part and percentage are based on weight.

Synthetic Example 1

To 400 parts of cresol novolak epoxy resin YDCN-703 (epoxy equivalent: 200, a product of Tohto Kasei Co., Ltd.), 55 parts of p-hydroxyphenyl-2-ethanol, 120 parts of acrylic acid, 246 parts of ethylcarbitol acetate, 3 parts of triphenylphosphine, and 0.5 part of methyl hydroquinone were added, and the reaction was carried out at 110° C. for 12 hours, thereby obtaining an ethylcarbitol acetate solution (A-1) containing a curable resin with an acid value of 9 in a proportion of 70 percent.

Synthetic Example 2

To 400 parts of the solution (A-1) obtained in Synthetic Example 1, 66 parts of tetrahydrophthalic anhydride was added, and the reaction was carried out at 100° C. for 5 hours, thereby obtaining an ethylcarbitol acetate solution (A-2) containing a curable resin having carboxyl groups with an acid value of 79 in a proportion of 74 percent.

Synthetic Example 3

To 200 parts of the solution (A-2) obtained in Synthetic Example 2, 4 parts of a bisphenol A epoxy resin GY-250 (epoxy equivalent: 185, a product of Chiba Geigy Co., Ltd.) was added, and the reaction was carried out at 110° C. for 5 hours, thereby obtaining an ethylcarbitol acetate solution (A-3) containing a high molecular weight curable resin having carboxyl groups with an acid value of 69 in a proportion of 75 percent.

Synthetic Example 4

To 400 parts of phenol novolak epoxy resin EPPN-201 (epoxy equivalent: 187, a product of Nippon Kayaku Co., Ltd.), 117 parts of ethylene glycol salicylate, 56 parts of acrylic acid, 67 parts of methacrylic acid, 274 parts of ethylcarbitol acetate, 3 parts of triphenylphosphine, and 0.5 part of methyl hydroquinone were added, and the reaction was carried out at 110° C. for 12 hours, thereby obtaining an ethylcarbitol acetate solution (A-4) containing a curable resin with an acid value of 9 in a proportion of 70 percent.

Synthetic Example 5

To 400 parts of the solution (A-4) obtained in Synthetic Example 4, 64 parts of tetrahydrophthalic anhydride was added, and the reaction was carried out at 100 ° C. for 5 hours, thereby obtaining an ethylcarbitol acetate solution (A-5) containing a curable resin having carboxyl groups with an acid value of 80 in a proportion of 74 percent.

Comparative Synthetic Example 1

To 400 parts of the same type of cresol novolak epoxy resin as that used in Synthetic Example 1, 148 parts of acrylic acid, 235 parts of ethylcarbitol acetate, 3 parts of triphenylphosphine, and 0.5 part of methyl hydroquinone were added, and the reaction was carried out at 110° C. for 10 hours, thereby obtaining an ethylcarbitol acetate solution (B-1) containing a curable resin for comparison with an acid value of 9 in a proportion of 70 percent.

Comparative Synthetic Example 2

To 400 parts of the solution (B-1) obtained in Comparative Synthetic Example 1, 60 parts of tetrahydrophthalic anhydride was added, and the reaction was carried out at 100° C. for 5 hours, thereby obtaining an ethylcarbitol acetate solution (B-2) containing a curable resin having carboxyl groups for comparison with an acid value of 75 in a proportion of 74 percent.

Comparative Synthetic Example 3

To 400 parts of the solution (B-1) obtained in Comparative Synthetic Example 1, 93 parts of tetrahydrophthalic anhydride was added, and the reaction was carried out at 100° C. for 5 hours, thereby obtaining an ethylcarbitol acetate solution (B-3) containing a curable resin having carboxyl groups for comparison with an acid value of 102 in a proportion of 76 percent.

Examples 1 to 5 and Comparative Examples 1 to 3

Using each curable resin-containing solution obtained in Synthetic Examples 1 to 5 and Comparative Synthetic Examples 1 to 3, a liquid photo-curable resin composition was prepared under the blending ratio shown in Table 1. Then, the properties of each resin composition were evaluated in the following manner. The results of the evaluation is shown in Table 1.

[Evaluation of Tack-free property]

The resin composition was applied onto a degreased and washed copper-clad laminate having a thickness of 1.6 mm in a thickness of 20 to 30 μm, and dried at 80° C. for 30 minutes in a hot air-circulating type heating oven, thereby obtaining a coating layer. The coating layer was touched with fingers to evaluate the tack-free property based on the following standards:

◯: None tacky.

Δ: Slightly tacky.

×: Very tacky.

[Evaluation of Developability-1]

A dried coating layer was formed by repeating the steps of tack-free property evaluation. Then, development was conducted in propyleneglycol monomethylether acetate at 30° C. for 80 seconds. Whether or not a coating layer remained on the copper-clad laminate was visually observed to evaluate the developability based on the following standard:

◯: No coating layer remained.

Δ: Some of the coating layer remained.

[Evaluation of Developability-2]

A dried coating layer was formed by repeating the steps of tack-free property evaluation. Then, development was conducted in a 1 percent $Na_2CO_3$ aqueous solution at 30° C. for 80 seconds. Whether or not the coating layer remained on the copper-clad laminate was visually observed to evaluate the developability based on the same standard as those used in Evaluation of Developability-1.

[Evaluation of boilproof]

A dried coating layer was formed by repeating the steps of tack-free property evaluation. Then, the coating layer was exposed to light with a luminous energy of 500 $mJ/cm^2$ from an extra-high pressure mercury lamp of 1 kW to be cured. Then, the cured coating layer was heated at 150° C. for 30 minutes to be subjected to high temperature, and was soaked into boiling ion exchanged water for 1 minute. The condition of the coating layer after soaking was visually observed to evaluate the boilproof based on the following standards:

◯: No change was observed in the appearance of the cured coating layer.

×: A part of the cured coating layer swelled or peeled off.

[Evaluation of adhesion]

A dried coating layer was formed by repeating the steps of tack-free property evaluation. Then, the dried coating layer was exposed to light with a luminous energy of 500 $mJ/cm^2$ from an extra-high pressure mercury lamp of 1 kW to be cured. Then, the cured coating layer was heated at 150° C. for 30 minutes to be subjected to high temperature. A peeling test with an adhesive tape to be cured coating layer was carried out, and the peeling condition thereof was visually observed to evaluate the adhesion based on the following standard:

◯: Good adhesion to be copper-clad laminate.

×: Peeling from the laminate was observed.

TABLE 1

|  |  | Kind and amount of curable resin solution (parts) | Monomer (parts)* | Photo-polymerization initiator (parts)** | Tack-free property | Develop-ability-1 | Develop-ability-2 | Boil-proof | Adhesion |
|---|---|---|---|---|---|---|---|---|---|
| Example | 1 | A-1: 100 | 10 | 5 | ◯ | ◯ |  | ◯ | ◯ |
|  | 2 | A-2: 100 | 10 | 5 | ◯ |  | ◯ | ◯ | ◯ |
|  | 3 | A-3: 100 | 10 | 5 | ◯ |  | ◯ | ◯ | ◯ |
|  | 4 | A-4: 100 | 10 | 5 | ◯ | ◯ |  | ◯ | ◯ |
|  | 5 | A-5: 100 | 10 | 5 | ◯ |  | ◯ | ◯ | ◯ |
| Comparative | 1 | B-1: 100 | 10 | 5 | Δ | ◯ |  | X | X |
| Example | 2 | B-2: 100 | 10 | 5 | Δ |  | X | X | X |
|  | 3 | B-3: 100 | 10 | 5 | Δ |  | ◯ | X | X |

Remarks:
*: Dipentaerythritol hexacrylate
**: "Irgacure 907"; a photo-polymerization initiator, a product of Chiba Geigy Co., Ltd.

According to the present invention, the curable resin can be used in the same manner as conventional curable resins, and due to the presence of alcoholic hydroxyl groups, the curable resin is capable of forming a cured product having excellent properties. The curable resin composition prepared using the curable resin is useful in applications including electric printed circuit boards and composite materials for insulating board to which high heat resistance, moisture resistance, and flexibility are required, as well as adhesive agents and coating materials. The liquid photo-curable resin composition prepared using the curable resin allows fine processing and image-formation, and therefore, is useful in applications including printing plates and various resist materials.

What is claimed is:

1. A radically polymerizable curable resin obtained by modifying an epoxy resin by reacting a phenol compound having an alcoholic hydroxyl group and an unsaturated monobasic acid to the epoxy resin having two or more epoxy groups in a molecule.

2. A curable resin according to claim 1, wherein 0.01 to 0.6 moles of the phenol compound is reacted with respect to 1 chemical equivalent of the epoxy groups of the epoxy resin.

3. A curable resin according to claim 1, wherein 0.4 to 0.99 moles of the unsaturated monobasic acid is reacted with respect to 1 chemical equivalent of the epoxy groups of the epoxy resin.

4. A curable resin according to claim 1, wherein 0.8 to 1.1 moles of the phenol compound and the unsaturated monobasic acid in total is reacted with respect to 1 chemical equivalent of the epoxy groups of the epoxy resin.

5. A curable resin obtained by reacting the curable resin of claim 1 with a polybasic anhydride.

6. A curable resin according to claim 5, wherein 0.1 to 1.1 moles of the polybasic anhydride is reacted with respect to 1 chemical equivalent of the hydroxyl groups of the curable resin of claim 1.

7. A curable resin obtained by reacting curable resin of claim 1 and/or the curable resin of claim 5 with a chain-extension agent having two or more functional groups in a molecule reactable with the functional groups of the curable resin of claim 1 and/or the curable resin of claim 5.

8. A curable resin composition comprising the curable resin of claim 1 and/or the curable resin of claim 5 and a polymerization initiator.

9. A curable resin composition comprising the curable resin of claim 7 and a polymerization initiator.

* * * * *